United States Patent [19]

Quentin

[11] Patent Number: 5,158,911
[45] Date of Patent: Oct. 27, 1992

[54] METHOD FOR INTERCONNECTION BETWEEN AN INTEGRATED CIRCUIT AND A SUPPORT CIRCUIT, AND INTEGRATED CIRCUIT ADAPTED TO THIS METHOD

[75] Inventor: Pierre Quentin, Paris, France

[73] Assignee: Thomson Composants Microondes, Puteaux, France

[21] Appl. No.: 734,694

[22] Filed: Jul. 23, 1991

[30] Foreign Application Priority Data

Aug. 3, 1990 [FR] France ................. 90 09968

[51] Int. Cl.⁵ ............................................. H01L 21/60
[52] U.S. Cl. ..................................... 437/209; 437/211; 437/217; 437/974; 357/70
[58] Field of Search ............... 437/209, 211, 217, 220, 437/974; 357/70

[56] References Cited

U.S. PATENT DOCUMENTS

| | | | |
|---|---|---|---|
| 4,483,067 | 11/1984 | Parmentier | 437/209 |
| 4,784,970 | 11/1988 | Solomon | 437/974 |
| 4,927,784 | 5/1990 | Kazior et al. | 437/209 |
| 4,974,093 | 12/1988 | Tong et al. | 437/974 |
| 5,063,177 | 11/1991 | Geller et al. | 437/209 |

Primary Examiner—Brian E. Hearn
Assistant Examiner—Kevin M. Picardat
Attorney, Agent, or Firm—Oblon, Spivak, McClelland, Maier & Neustadt

[57] ABSTRACT

Disclosed is a method for the interconnection of an integrated circuit to a support, replacing the connection wires. An integrated circuit chip is fixed to a support by the brazing of the ground plane metallizations. However, the input/output pads of the integrated circuit are connected to the metallized tracks of the support by means of metallized holes. The method can be applied to microwave circuits. FIG. 3.

7 Claims, 1 Drawing Sheet

"PRIOR ART"

METHOD FOR INTERCONNECTION BETWEEN AN INTEGRATED CIRCUIT AND A SUPPORT CIRCUIT, AND INTEGRATED CIRCUIT ADAPTED TO THIS METHOD

BACKGROUND OF THE INVENTION

1. Field of the Invention

The present invention relates to integrated circuit interconnections and to methods for interconnection of an integrated circuit, in the field of microwave applications. According to this method, numerous advantages, for example those of reliability and reproducibility, are related to the connection of the inputs/outputs of a chip by its rear face, through metallized holes that go through the chip. The invention also includes the integrated circuit, as a product provided with connection holes.

2. Description of the Prior Art

Connection systems for the inputs/outputs of integrated circuits are, in most cases, based on standard methods using wires or strips to set up the connections between the integrated circuit chip and its supporting circuit. For production in large quantities, the cost of wiring forms a substantial part of the total cost of the electrical function, even when automatic wiring machines are used. Furthermore, in the field of microwave circuits, it is known that the metal interconnection wires, however short they may be, have an inductance of the order of 0.2 to 0.3 nH (when an inductance value of less than 0.1 nH is needed) for a given frequency.

The use of TAB (tape automatic bonding) films, metal beads on the contact pads or, again, flip-chip mounting, namely the mounting of the active face of the integrated circuit against a supporting circuit, are three known methods that provide for group interconnection. These methods are either unsuited to microwave applications or require a preparation of the chip. It is impossible to have access to the chip if it is in a flip-chip mounting.

SUMMARY OF THE INVENTION

The invention proposes to eliminate connections by wires or strips soldered to the front or upper face of the chip, and to bring the connection pads to the rear face of the monolithic circuit which is the substrate side. The electrical connections between the integrated components on the monolithic circuit and the pads on the rear face are set up by metallized holes which go through the chip through its entire thickness.

Furthermore, the rear face, which is very generally metallized, is etched to insulate the connection pads, and to provide a passage towards these pads to the metal tracks of the supporting circuit.

For an integrated circuit provided with the means of the invention, all the external access pads of the integrated circuit are connected to the supporting circuit during the step for attaching the integrated circuit to the supporting circuit, provided that the latter is adapted accordingly, since the metal tracks have to be extended to penetrate beneath the integrated circuit chip.

More precisely, the invention relates to a method of interconnection between an integrated circuit and a supporting circuit, wherein the integrated circuit has a chip made of a semiconductor material, a first face of which supports a ground metallization, and a second face of which supports an active region of components, connected by metallizations to metal input/output pads and wherein the support circuit includes an insulating substrate on which there is deposited a network of metal tracks and a fixing metallization; a method wherein the integrated circuit is fixed to the supporting circuit by its first face, and wherein the inputs/outputs of the integrated circuit are connected to the metal tracks of the supporting circuit by means of metal holes made through the body of the integrated circuit.

BRIEF DESCRIPTION OF THE DRAWINGS

The invention will be understood more clearly from the following description of an exemplary application, made with reference to the appended drawings, of which.

MORE DETAILED DESCRIPTION

Figure 1:
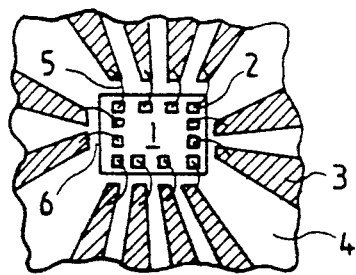
FIG. 1 shows a plane view of an external connection diagram of a chip according to the prior art.

FIG. 1 shows a top view of the standard mounting of an integrated circuit chip on a supporting circuit. Only a small region of this supporting circuit, surrounding the chip, has been shown.

An integrated circuit chip 1 is provided, on its upper face or, again, its active face, with metal connection pads 2. The external access paths, inputs or outputs, bias voltages etc. are formed by metal tracks 3 etched on an insulator support 4. To connect the integrated circuit 1 to its environment, it is necessary first of all to fix the chip 1 to the support 4, by brazing, then to solder wires or metal strips 5 to the pads 2 and to the ends of the metal tracks 3 which come as close as possible to the chip 1, but do not penetrate beneath the chip, otherwise they would be short-circuited. This is why there must be a gap 6 between the chip and the end of the tracks. This operation for the "sewing" of the wires is a long and delicate one, even with automatic machines. Indeed, especially in microwave applications, the metal wires 5 should be as short as possible, owing to the parasitic inductances that they give.

There are two possible cases: either the chip 1 is brazed to the face of the insulating support 4, or else it is fixed to the bottom of a depression formed in this support 4. If it is at the surface of the support 4, there is a difference in level between the plane of pads 2 on the chip 1 and the plane of the tracks 3 on the support 4: the connection wires 5 should form a loop so as not to touch the edge of the chip 1, and this loop increases the parasitic inductance. To avoid this difference in level, it is possible to create a depression in which the chip is positioned: the connections are then set up by means of strips or flat metal bars which replace the curved wires 5. However, it is clear that these operations increase the mounting and wiring costs.

The invention provides a major simplification by proposing to fix an integrated circuit chip 1 right side up on a supporting circuit (which is a standard arrangement) but with the electrical contacts taken on the rear face of the chip, which is crossed throughout its thickness by metallized holes, in such a way that the rear face, on the substrate side, of the chip becomes simultaneously the face for fixing the chip (by brazing) and the interconnection face.

Figure 2:
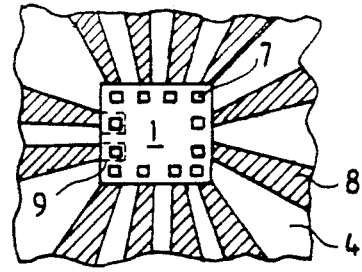
FIG. 2 shows the same type of connection according to the invention.

FIG. 2 shows an assembly which is equivalent to that of FIG. 1, but is interconnected according to the invention. The integrated circuit chip 1 is pierced with metallized holes (which shall be described further below). These metallized holes cannot be seen here because they are concealed by a metal lid 7 which is used, if necessary, to test the chip. On the insulator support 4, the metal tracks 8 are slightly modified with respect to the prior art tracks 3. Two of these metal tracks 8 penetrate beneath the chip, as shown by dashes referenced 9, in order to make contact on the metallized holes.

Figure 3:
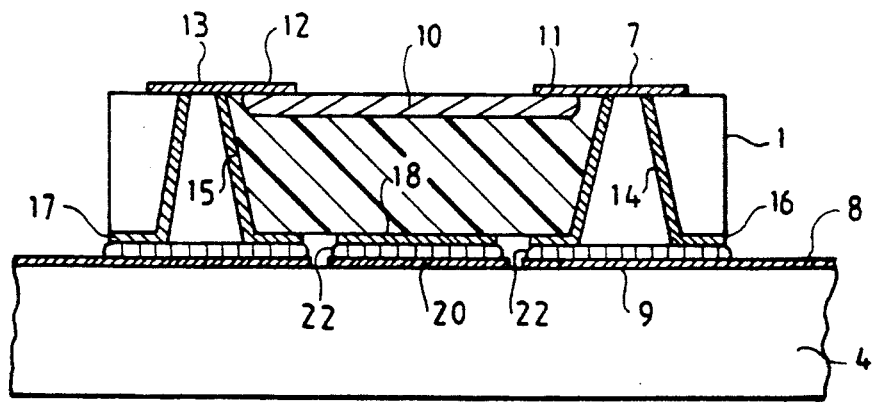
FIG. 3 shows a sectional view of a chip provided with connection means according to the invention.

FIG. 3 shows an enlarged sectional view enabling the integrated circuit chip to be described in greater detail. To this end, the proportions have not been maintained.

Figure 4:
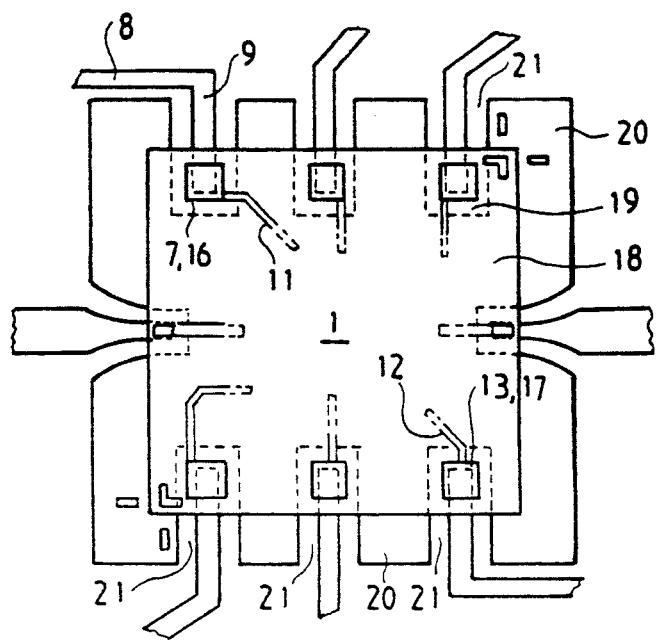
FIG. 4 shows a plane view of a chip mounted on a supporting circuit by means of metallized holes.

The integrated circuit 1 has a substrate that supports a region 10 on which the active and passive circuits of the integrated circuit are made. These components and the different layers of materials of the region 10 are not shown for they are not necessary to the explanation of the invention, but they have access to metallizations, of which two are shown. The metallization 11 leads to the metal pad 7, and the metallization 12 leads to the metal pad 13. Each of the metal pads 7 or 13 of the upper or active face of the integrated circuit is connected by means of a metallized hole, 14 or 15, with a metal surface 16 or 17 respectively, located on the lower face, or substrate, of the integrated circuit. Thus, the plane of the external access connections is shifted from the upper face to the lower face of the integrated circuit chip. This integrated circuit chip has a round plane metallization 18, which is used to braze the chip 1 to its supporting circuit. However, the presence of the metal surfaces 16 and 17 on the rear face of the chip 1 necessitates an etching of the ground plane 18, which is shown in FIG. 4.

In this figure, it can be seen more clearly that the ground plane metallization 18 has a crenellated rim, insulating surfaces having been etched to create the surfaces 16 and 17 on the edges of the chip 1. This figure also shows that the supporting circuit 4 (not shown) has a metallization 20 to receive the integrated circuit which can be brazed thereto by means of its ground plane 18. This metallization 20 itself also includes notches 21, corresponding to the surfaces 19. These notches 21 are designed to let the conductive tracks 8+9 reach the metal regions 16, 17.

The superimposition of the integrated circuit on its supporting circuit explains the fact that the metal pads 7 and 16, 13 and 17, or the surfaces 19 and notches 21 are superimposed.

The two operations for fixing the integrated circuit to its support and for connecting the access pads of the integrated circuit to the support are done in one and the same collective brazing operation. The surfaces 16, 17 are brazed to the conductive tracks 9, and the ground plane 18 is brazed to the metallization 20, simultaneously, either by means of additional deposit of germanium-gold on the different metallizations present, or by means of a soft solder preform. The latter method is extremely promising, for it is faster and more economical than the former one. Although the brazing operation should be in keeping with the electrical insulation between the ground plane and the input/output surfaces 16, 17, it is enough to position a fairly fine soft solder preform for it to divide, during its melting, into fragments 22 which assume the contours of the metal surfaces to be brazed by capillarity. Thus, a single preform gives several mutually insulated brazings 22.

The metallized holes 14, 15 are generally positioned on the rim of the chip 1, for convenience in the tracing of the network of conductive tracks 8+9 on the supporting circuit. However, there may be one or more metallized holes in the central region of the chip 1, either to make a ground contact, which is known, or to set up an external link, which imples that the corresponding notches 19+21 are deepened accordingly.

The invention provides valuable advantages, especially in microwave applications. These advantages include:

A reduction in mounting costs, since the connections are done at the same time as the attaching operation. Furthermore, this is a batch technique.

An increase in reliability through the elimination of the wires and the reduction, by a factor of 2, of the number of contacts.

A reduction in the stresses on the upper surface of the integrated circuit chip.

A reduction in the parasitic inductance of interconnection by a factor of 6; this parasitic inductance is reduced so some tens of nH per metallized hole.

The possibility of compensation by localized capacitance on the front face and rear face of the chip;

The reproducibility of the interconnection inductance, reducing the phase dispersal due to the wiring.

The invention, which is for general use with semiconductor devices made of Si or III-V materials, is above all applied to the field of microwaves. It is specified in the following claims.

What is claimed is:

1. A method for interconnecting an integrated circuit semiconductor chip to a supporting circuit, said semiconductor chip having first and second surfaces, a ground metallization disposed on said second surface and an active component region disposed in said first surface, and metallization holes between the first and second surfaces for electrically connecting active components of said active component region to said supporting circuit, said supporting circuit comprising an insulating substrate having a network of metal tracks and a fixing metallization on a connecting surface thereof, wherein said connecting surface is opposed to said second surface, said metallization holes have openings in said second face which are opposed to ends of corresponding metal tracks of said network, comprising the steps of:

bonding said metallization holes to said corresponding metal tracks;

bonding said second surface to said connecting surface; and etching notches out of the fixing metallization so that the said notches surround ends of said metal tracks, thereby insulating said metal tracks from said fixing metallization.

2. A method for electrically interconnecting an active component region of an integrated circuit disposed in a first surface of a semiconductor chip to support circuitry disposed on an insulating substrate, comprising the steps of:

forming a metallization hole between said first surface and a second surface opposed thereto;

forming a ground metallization on said second surface;

forming a metal track and a fixing metallization which is electrically insulated from said metal track on a connecting surface of said insulating substrate; and bonding said second surface to said connecting surface so that said metallization hole electrically connects to said metal track and is electrically isolated from regions of said ground metallization which form a ground plane.

3. A method according to claim 2, wherein:
said integrated circuit comprises a microwave circuit.

4. A method of interconnection according to claim 2, wherein the step of binding comprises brazing said ground metallization to the fixing metallization.

5. A method of interconnection according to claim 2, wherein the metallization hole in said semiconductor chip electrically connected to a metallized surface on the second face of the integrated circuit chip, which is itself and said metallization surface is brazed to an end of a metallic track of the supporting circuit.

6. A method of interconnection according to claim 5, wherein:
the metallized surface comprises a region of the ground metallization, and
said method further comprises the step of etching said ground metallization to electrically isolate said region from other regions of said ground metallization.

7. A method of interconnection according to claim 5 further comprising the step of:
etching notches out of the fixing metallization so that said notches surround and insulate the ends of the tracks.

* * * * *